US006581387B1

(12) United States Patent
Ullom

(10) Patent No.: US 6,581,387 B1
(45) Date of Patent: Jun. 24, 2003

(54) SOLID-STATE MICROREFRIGERATOR

(75) Inventor: Joel N. Ullom, Livermore, CA (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 10/075,789

(22) Filed: Feb. 12, 2002

Related U.S. Application Data

(60) Provisional application No. 60/269,107, filed on Feb. 12, 2001.

(51) Int. Cl.$^7$ .................... F25B 21/00; F25B 21/02
(52) U.S. Cl. ................. 62/3.1; 136/203; 136/236.1
(58) Field of Search ................... 62/3.1; 136/203, 136/236.1

(56) References Cited

U.S. PATENT DOCUMENTS

| | | | |
|---|---|---|---|
| 5,634,718 A | 6/1997 | Martinis et al. | 374/32 |
| 5,974,806 A | 11/1999 | Pekola et al. | 62/3.1 |
| 5,994,694 A | * 11/1999 | Frank et al. | 250/281 |

OTHER PUBLICATIONS

M. M. Leivo et al., "On–chip refrigeration by evaporation of hot electrons at sub–kelvin temperatures", *Department of Physics*, University of Jyvaskyla, P.O. Box 35, FIN–4k0351, Jyvaskyla, Finland, Jun. 10, 1999.

J. Jochum et al., "Modeling the power flow in normal conductor–insulator–superconductor junctions", *Journal of Applied Physics*, vol. 83, No. 6, pp. 3217–3224, Mar. 15, 1998.

M. M. Leivo et al., "Efficient Peltier refrigeration by a pair of normal metal insulator/superconductor junctions", *Applied Phys. Lett.* 68 (14), Apr. 1, 1996, pp. 1996–1998.

J. N. Ullom et al., "Quasiparticle behavior in tunnel junction refrigerators", *Physica B*, vol. 284–288, pp. 2036–2038, 2000.

P. A. Fisher et al., "High–power on–chip microrefrigerator based on a normal–metal/insulator/superconductor tunnel junction", *Applied Physics Letters*, vol. 74, No. 18, May 3, 1999.

M. Nahum et al., "Electronic microrefrigerator based on a normal–insulator–superconductor tunnel junction", *Appl. Phys. Lett.*, vol. 65, pp. 3123–3125, 1994.

\* cited by examiner

*Primary Examiner*—William C. Doerrler
(74) *Attorney, Agent, or Firm*—William C. Daubenspeck; Paul A. Gottlieb

(57) ABSTRACT

A normal-insulator-superconductor (NIS) microrefrigerator in which a superconducting single crystal is both the substrate and the superconducting electrode of the NIS junction. The refrigerator consists of a large ultra-pure superconducting single crystal and a normal metal layer on top of the superconducting crystal, separated by a thin insulating layer. The superconducting crystal can be either cut from bulk material or grown as a thick epitaxial film. The large single superconducting crystal allows quasiparticles created in the superconducting crystal to easily diffuse away from the NIS junction through the lattice structure of the crystal to normal metal traps to prevent the quasiparticles from returning across the NIS junction. In comparison to thin film NIS refrigerators, the invention provides orders of magnitude larger cooling power than thin film microrefrigerators. The superconducting crystal can serve as the superconducting electrode for multiple NIS junctions to provide an array of microrefrigerators. The normal electrode can be extended and supported by microsupports to provide support and cooling of sensors or arrays of sensors.

7 Claims, 3 Drawing Sheets

SOLID-STATE MICROREFRIGERATOR

CROSS-REFERENCE TO RELATED APPLICATIONS

This Application claims priority from Provisional Patent Application No. 60/269,107 filed Feb. 12, 2001. The entire contents of such Provisional Patent Application are hereby incorporated herein by reference.

SOLID-STATE MICROREFRIGERATOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to microrefrigerators and, in particular to a solid-state microrefrigerator based on normal metal-insulator-superconductor (NIS) tunnel junctions. The invention relates especially to a microrefrigerator using a single crystal as both the substrate and superconducting electrode of the NIS junction refrigerator.

NIS tunnel junctions are a promising technology for cooling to temperatures near 0.1 Kelvin (K) from bath temperatures near 0.3 K. These ultralow temperatures are desirable for the operation of thin-film sensors which measure energy deposited by particles and photons with great accuracy. Like any refrigerator, NIS junctions remove energy from one component, the normal metal electrode (a normal metal being any metal not in the superconducting state, e.g. silver, gold, copper) and dissipate a larger power in another component, the superconducting electrode. When a NIS junction is biased at a voltage V slightly below $\Delta/e$, where $\Delta$ is the energy gap of the superconductor, current flow through the junction preferentially removes the hottest electrons from its normal electrode. Refrigeration is therefore achieved in a solid-state device that operates without vibration or moving parts.

Cooling by NIS junctions was described by Nahum et al, Applied Physics Letters, 65 (24), 12 December 1994 (See also U.S. Pat. No. 5,634,718.) and development has since been pursued by two groups. The first group, at Harvard University, focused on junctions with dimensions of 10×10 microns or larger. They have produced the largest cooling powers to date, about 40 pW at 0.2 K, but only small reductions in temperature (See Fisher et al., Appl. Phys. Lett., Volume 74, Number 18, page 2705, May 3, 1999). The cause of this limited performance has been identified as heating in the superconducting electrode of these devices (See Ullom et al., Physica B 284–288 (2000) 2036–2038). The second group, at the University of Jyväskylä in Finland, has focused on devices with sub-micron dimensions (one micron or less) fabricated by electron-beam lithography (See U.S. Pat. No. 5,974,806). For devices of this size, heating of the superconducting electrode does not occur and the Jyväskylä work demonstrates that large temperature drops are feasible when this condition is met. Electrons have been cooled from 0.3 K to 0.1 K and photons from 0.3 K to 0.2 K (See Levio et al, AppL. Phys. Lett. 68,1996–1998 (1996) and Levio et al. Jun. 10, 1999). However, owing to the extremely small size of these devices, it is impossible to produce cooling powers much larger than 1 pW per junction at 0.3 K. As a result, these devices are probably only suited to cooling sub-micron sized hot electronic bolometers for millimeter wave measurements. To summarize, the Jyväskylä work demonstrates that if heating in the superconducting electrode can be overcome, substantial reductions in temperature are possible. The work at Harvard has shown that the techniques of Jyväskylä cannot be applied on larger scales for fundamental physical reasons.

If arrays of low temperature detectors are to be cooled, it is essential to provide devices in which the refrigeration junction and the cooling power are both large. It is therefore the purpose of the present invention to overcome the effects that have previously prevented cooling in large NIS junctions.

SUMMARY OF THE INVENTION

It is therefore an object of the present invention to provide a microrefrigerator for cooling to temperatures near 0.1 K from bath temperatures near 0.3 K.

It is another object of the present invention to provide such a microrefrigerator providing a large cooling power.

It is another object of the present invention to provide such a microrefrigerator having a large cooling power and also having a large (10s to 100s of microns) NIS junction.

It is a further object of the present invention to provide an NIS refrigerator capable of cooling multiple low temperature detectors or an array of detectors.

It is still another object of the invention to reduce the amount of power that returns from the superconducting electrode to the normal electrode in an NIS refrigerator.

It is still another object of the present invention to keep the density of quasiparticles small in the superconducting electrode in an NIS refrigerator.

Briefly, these and other objects are provided by the present invention in which an ultra-pure superconducting single crystal is both the substrate and the superconducting electrode of the NIS junction of the NIS refrigerator. The refrigerator consists of a large ultra-pure superconducting single crystal forming the superconducting electrode and the device substrate and a thin film normal metal layer on top of the superconducting crystal forming the normal electrode, separated by a thin insulating layer forming a tunnel barrier. The superconducting crystal can be either cut from bulk material or grown as a thick epitaxial film. The large single superconducting crystal allows quasiparticles created in the superconducting crystal due to electrons tunneling from the normal electrode to easily diffuse away from the NIS junction through the crystal to traps of normal metal. This prevents the quasiparticles from returning across the NIS junction. In comparison to conventional thin film NIS refrigerators, the invention provides orders of magnitude larger cooling power by using the large crystal as the superconducting electrode. The invention can cool sensors from 0.3 K to an operating temperature of 0.1 K or 0.05 K and therefore allow operation of a cryogenic photon sensor using a relatively simple pumped helium-3 refrigerator, or it can be used to extend the operation time below 0.1 K of adiabatic demagnetization refrigerators.

Other objects, advantages and features of the present invention will become apparent from the following description when considered in conjunction with the accompanying drawings wherein like or similar reference characters refer to similar elements in the several views.

DETAILED DESCRIPTION OF THE INVENTION

Figure 1A:
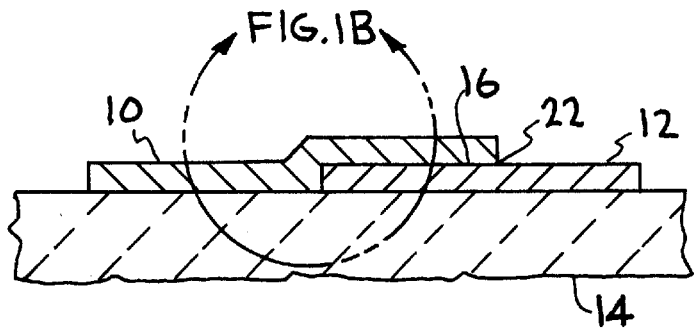
FIG. 1a is a schematic cross-sectional drawing of a typical conventional thin film NIS refrigerator.
Figure 1B:
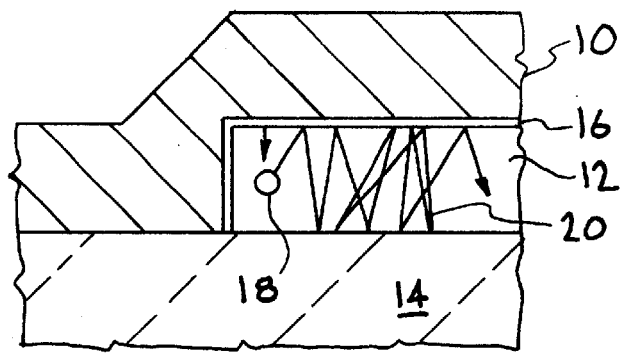
FIG. 1b is a partial expanded view of the area identified by dashed line 1b in FIG. 1a and illustrating electron tunneling from the normal electrode to the superconducting electrode in the conventional thin film NIS refrigerator.

Referring now to the drawings, FIGS. 1a and 1b illustrate a conventional NIS refrigerator constructed from thin films. A thin film normal metal electrode (normal electrode) 10 and a thin film superconducting metal (superconducting electrode) electrode 12 are disposed on an insulating substrate 14, with the normal metal electrode also extending over the superconducting metal electrode. The normal electrode 10 is typically made from a material such as copper (Cu), silver (Ag) or gold (Au); the superconducting electrode 12 is typically made from a material such as aluminum (Al), tantalum (Ta) or niobium (Nb); and the substrate 14 is typically made from silicon (Si) The electrodes 10 and 12 are typically approximately 0.1 micron in thickness. A thin insulating layer 16 is formed between the superconducting electrode 12 and the overlaying normal electrode 10. Insulating layer 16 may typically formed by oxidation at the surface of the superconducting electrode 12 or a thin insulating layer may be added by various depositon techniques and is typically 10–20 Å° in thickness. Additional wiring to the normal electrode for thermometry and grounding has been omitted for clarity. An NIS junction (tunnel barrier) is present at the interface defined by normal metal electrode 10, insulating layer 16 and superconducting electrode 12.

NIS junctions remove energy from the normal electrode 10 and dissipate the power in the-superconducting electrode 12. The base temperature of any refrigerator is determined by the balance between the cooling power and the thermal load. In NIS tunnel junctions, a fraction of the power dissipated in the superconducting electrode can return to the normal electrode, thus reducing the cooling efficiency of the refrigerator. It is crucial that the NIS refrigerator be designed so that the fraction of power returned is at most a few percent.

Current flow through the NIS junction creates electronic excitations called quasiparticles in the superconducting electrode. The presence of quasiparticles both reduces the cooling power of the junction and leads to the production of phonons when quasiparticles (similar to electron-hole pairs) recombine into superconducting Cooper pairs. The phonons can easily return to the normal electrode, which they then reheat. To minimize these two effects, it is essential that the quasiparticle density in the superconducting electrode be kept small.

However, in a conventional thin film device, the quasiparticle mean free path is at most the film thickness of the superconducting electrode, approximately 0.1 micron, and to exit the junction area, quasiparticles must diffuse a distance proportional to the junction length which can be 10's of microns. As a result, quasiparticles accumulate in the junction region.

In conventional thin film NIS refrigerators, power readily returns from the superconducting electrode 12 to the normal electrode 10 unless the NIS junctions (illustrated by dimension l in FIG. 1a) are less than approximately 1 micron. As illustrated in the expanded view of FIG. 1b, a tunneling electron 18 is unable to exit the superconducting electrode 12 quickly because it scatters many times off of the film (NIS junction) interfaces as indicated by the arrow 20. The tunneling electron 18 must reach the end 22 of the NIS junction before it can exit the superconducting electrode 12 into a normal metal trap (not shown).

To reduce the amount of power that returns from the superconducting electrode to the normal electrode, the present invention constructs the NIS refrigerator in an entirely new way by making the superconducting electrode a large-volume, ultra-pure single crystal which is both the superconducting electrode of the junction and the substrate. Using the approach of the present invention, device performance will not be degraded by power flow from the superconducting electrode to the normal electrode and the refrigerator size will be limited only by the junction area that can be made without a defect (pinhole) in the tunnel barrier (insulator layer 16).

Figure 2:
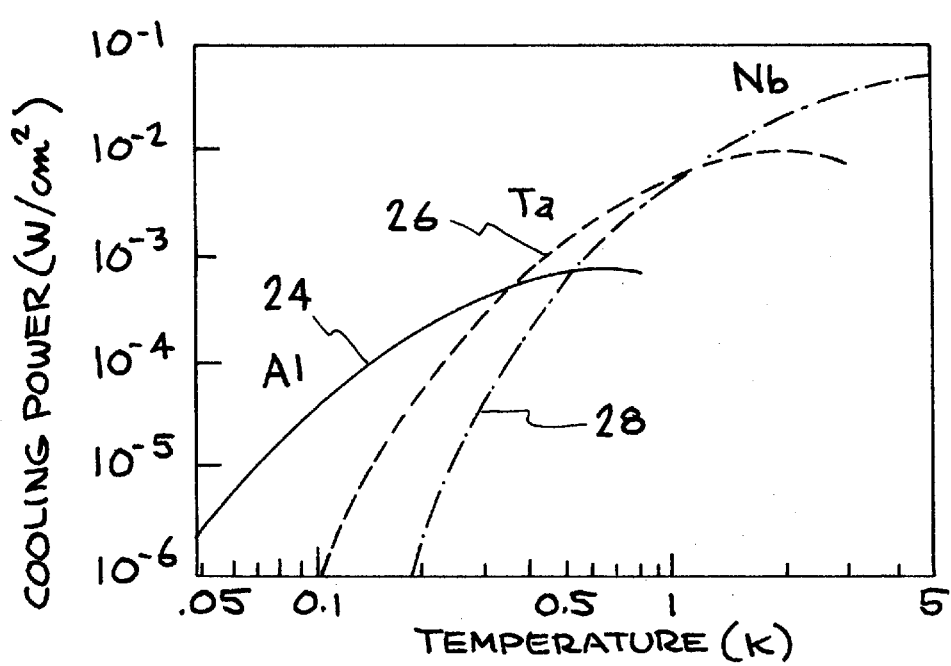
FIG. 2 is plot of the cooling power of Al, Ta, and Nb junctions versus temperature of the normal and superconducting electrodes.

In FIG. 2, the calculated cooling power per square centimeter of junction area as a function of temperature is shown for Al, Ta and Nb superconducting electrodes by solid line 24, dotted line 26, and dashed/dotted line 28, respectively. For a 1 $cm^2$ aluminum junction at 0.1 K, the cooling power approaches 50 $\mu$W which is comparable to a dilution refrigerator. For maximum cooling, it is desirable (1) for the junction to be large so that many electrons can tunnel, and (2) that the insulating barrier be thin (low resistance) so that electrons tunnel easily. For the calculations in FIG. 2, a conservative value (300 Ω $\mu^2$)for the resistance of the barrier has been assumed. A much higher cooling power is feasible with the present invention if the resistance of the tunnel barrier can be lowered. Resistances as low as 60 Ω$\mu^2$ have been reported.

Figure 3:
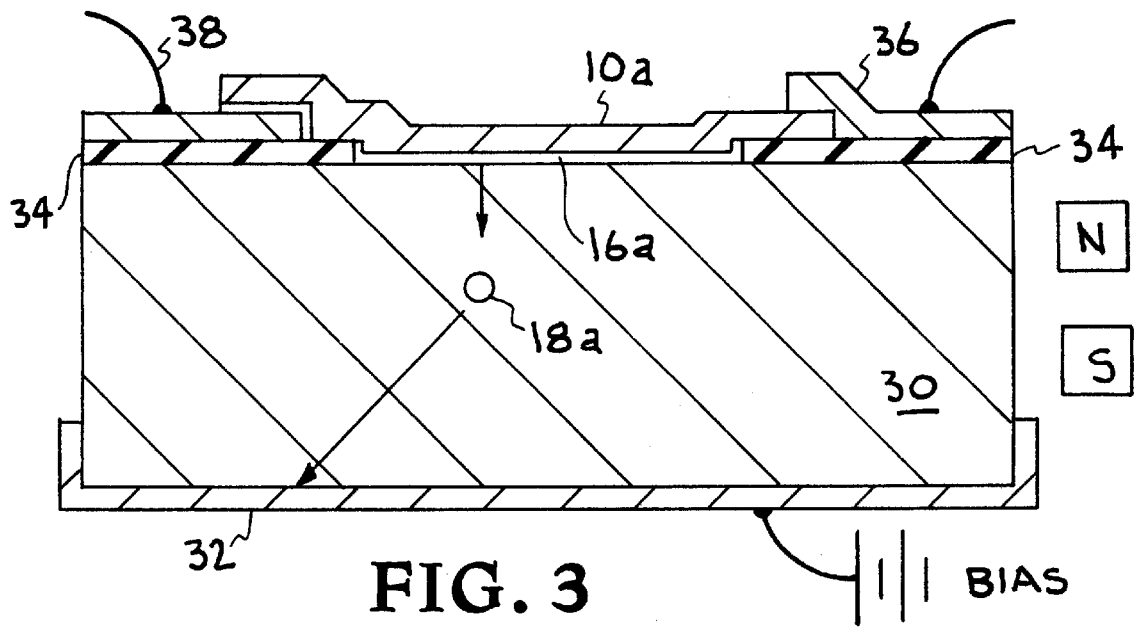
FIG. 3 is a schematic cross-sectional drawing of a preferred embodiment of the solid-state microrefrigerator of the present invention.

A schematic drawing of an NIS refrigerator according to the present invention is shown in FIG. 3. The normal electrode 10a is disposed on a large-volume, ultra-pure single crystal superconducting electrode 30. An insulating layer 16a is formed between the normal electrode 10a and the superconducting electrode 30 in the usual manner to complete the NIS junction (tunnel barrier) between the two electrodes. A normal metal trap 32 is disposed on the underside of the crystal 30 away from the NIS junction. After tunneling into the superconducting electrode 30, an electron 18a (now a quasiparticle), moves without scattering to the normal metal trap 32. Phonons emitted by recombining quasiparticles are also captured by the trap 32. A passivation/insulation layer 34 is provided to allow additional wiring to contact the normal electrode 10a for thermometry and grounding without contacting the superconducting electrode 30. The bias for the NIS junction is represented by the voltage V applied between the normal metal trap 32 and normal electrode 10a via contact layer 36. A thermometer lead 38 is coupled to normal electrode 10a via contact layer 40.

The electronic mean free path in ultra-pure crystals can be more than 1000 times larger that in thin films. Not only will the qaisiparticles diffuse away from the NIS junction much more quickly in a bulk crystal, the quasiparticle density will be diluted by the enormously larger volume of the crystal 30. Since the recombination rate scales as the square of the quasiparticle density, the power load on the normal electrode 10a due to recombination will be reduced by twice as many orders of magnitude as the quasiparticle density. The superconducting crystal 30 can be either cut from bulk material or grown as a thick epitaxial film. For operation at 0.3 K and above, the superconducting crystal 30 could be, but is not limited to Al, Mo, Sn, Ta, Nb and Pb. Materials suitable for the insulating tunnel barrier between the two electrodes 10a and 30 include $AlO_x$ and $SiO_x$.

In a device like the device in FIG. 3, the electrons in the normal metal can be cooled to less than 0.1 K. Cooling to 0.05 K will require junctions with low leakage resistances because of power dissipation in the leakage resistance of the junction.

Since the polished surface of the single crystal substrate must, with very little modification, form one electrode of the tunnel junction, extreme smoothness is required. Imperfections in the surface reduce the resistance of the tunnel barrier and cause leakage currents which degrade device performance. A second requirement for the single crystal substrate is preservation of the crystalline order of the surface. Damage to the crystal lattice will slow the motion of quaisipaticles away from the junction. There are a range of mechanical, chemical and electrochemical polishing techniques that may provide the required smoothness without damaging the crystal lattice. An RMS roughness of less than 1 nm has been achieved using a combination of mechanical and electromechanical polishing and is expected to be adequate for device fabrication.

A superconductor with a smaller energy gap than Al will have more cooling power below 0.1 K and therefore may be preferable for cooling to 0.05 K. Materials suitable for superconductor 30 in a device for cooling to 0.05 K may include ruthenium (Ru) and titanium (Ti).

Figure 4:
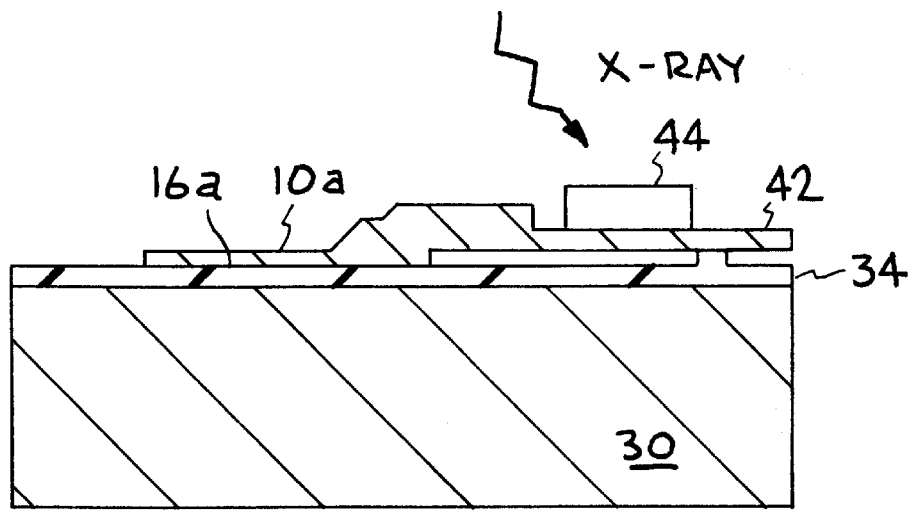
FIG. 4 is a schematic drawing illustrating an embodiment of the present invention for providing an array of microrefrigerators using a single superconducting crystal and/or adapted for cooling a sensor or an array of sensors.

Focal plane elements which are separate from the NIS refrigerator can be cooled by extending the normal electrode 10a of the NIS junction on to a suspended microstructure 42 which is cooled by the NIS refrigerator as shown in FIG. 4. The fabrication of suspended structures using surface micromachining techniques is well developed technology. The detectors/sensors, represented by sensor 44, which are mounted on the microstructure 42 are also cooled by the NIS refrigerator. If the thermal conductance between the microstructure 42 and the outside atmosphere is weak, then the sensors on the microstructrure will be cooled by the normal electrode 10a. Of course, the same large crystal can be used as the superconducting electrode of multiple NIS junctions to allow an array of refrigerators and/or an array sensors to be cooled.

Figure 5:
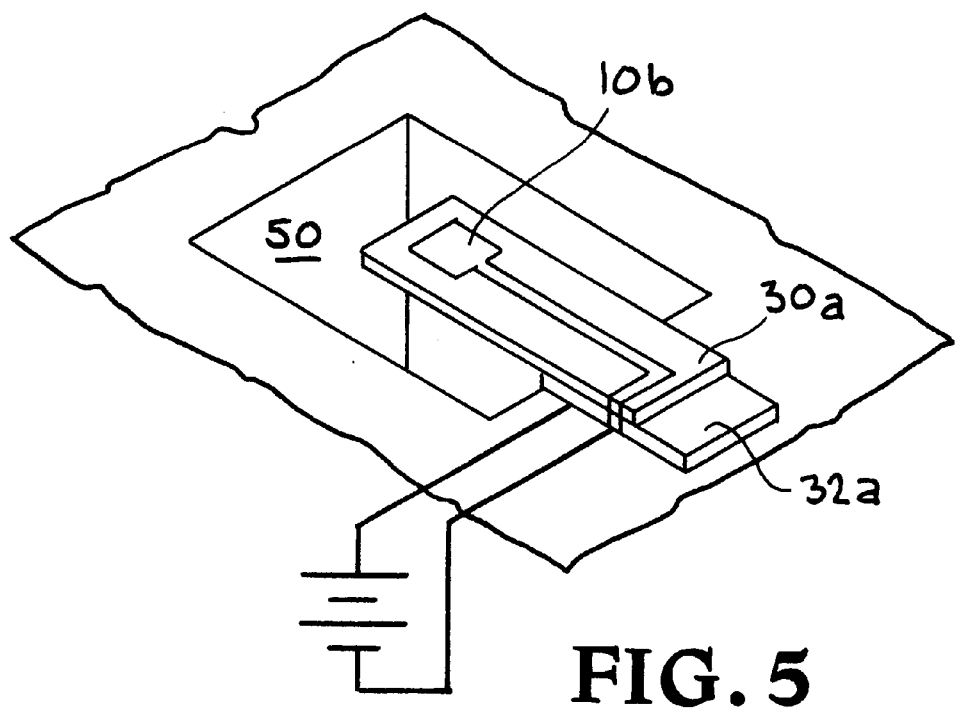
FIG. 5 is a schematic drawing illustrating a "diving board" microrefrigerator suitable for cooling from bath temperatures higher than 0.3 K.

FIG. 5 shows an embodiment of the present invention for cooling from bath temperatures higher than 0.3 K. Using Nb or Ta at 1 K, it is not possible to produce a significant temperature drop when the only thermal isolation is the thermal impedance between the phonons and electrons. A way to overcome this problem is to thin bulk crystals and physically isolate them from the substrate. This can be accomplished using configurations where the crystal is held from one end, two ends, corners or edges. For example, as shown in FIG. 5a, the superconducting crystal electrode 30a could be positioned in a "diving board" configuration over etched holes 50 in silicon. The insulating junction layer (not visible), the normal electrode layer 10b, and the normal trap 32a are disposed on the superconducting crystal 30a. The "diving board" is typically 250 microns long and power dissipated in the superconducting electrode 30a is assumed not to return to the normal electrode because of the thickness of the superconducting electrode.

Figure 6:
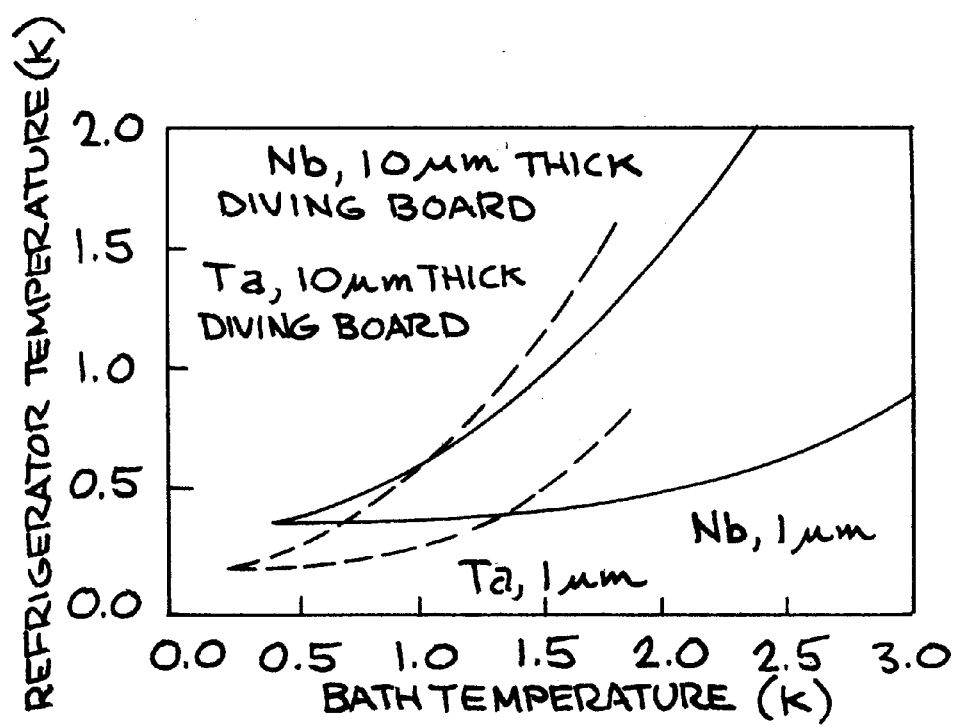
FIG. 6 is a plot of calculated microrefrigerator temperature versus bath temperature for a 10 micron and a 1 micron thick "diving board" in the microrefrigerator of FIG. 5.

Calculated base temperatures are shown in FIG. 6 wherein dashed curves 54 and 55, represent the calculated refrigerator temperature versus bath temperature for a 10 um and a 1 um thick diving board of Ta, respectively. Similiarly, solid curves 56 and 57 represent the calculated refrigerator temperature versus bath temperature for a 10 um and a 1 um thick diving board of Nb, respectively. If 1 $\mu$m of clean Ta is sufficient thickness to prevent a buildup of quasiparticles, then it is clear that cooling from 1.2 to 0.3 K is possible. A second Al crystal refrigerator could then be positioned at the end of the "diving board" to cool from 0.3 K to 0.1 K.

The foregoing description of preferred embodiment(s) of the invention is presented for purposes of illustration and description and is not intended to be exhaustive or to limit the invention to the precise form disclosed. Many modifications and variations are possible in light of the above teaching.

What is claimed is:

1. A solid-state microrefrigerator comprising:
    a superconducting crystal;
    a thin film electode of a normal metal; and
    an insulating tunnel barrier layer disposed between said superconducting crystal and said normal electrode.

2. The solid-state microrefrigerator of claim 1 further comprising: a quasiparticle trap of a normal metal disposed on a surface of the superconducting crystal away from the normal electrode.

3. The solid-state microrefrigerator of claim 2 further comprising a passivation layer disposed on a surface of the superconducting crystal.

4. The solid-state microrefrigerator of claim 1 wherein said thin film electrode extends onto a suspended microstructure for supporting a sensor.

5. The solid-state microrefrigerator of claim 4 wherein said microstructure is of a normal metal.

6. The solid-state microrefrigerator of claim 1 wherein said superconducting crystal is disposed on an insulating substrate and extends over a pit in said substrate.

7. The solid-state microrefrigerator of claim 6 further comprising: a quasiparticle trap of a normal metal disposed on a surface of the superconducting crystal away from the normal electrode.

* * * * *